Figure 1:
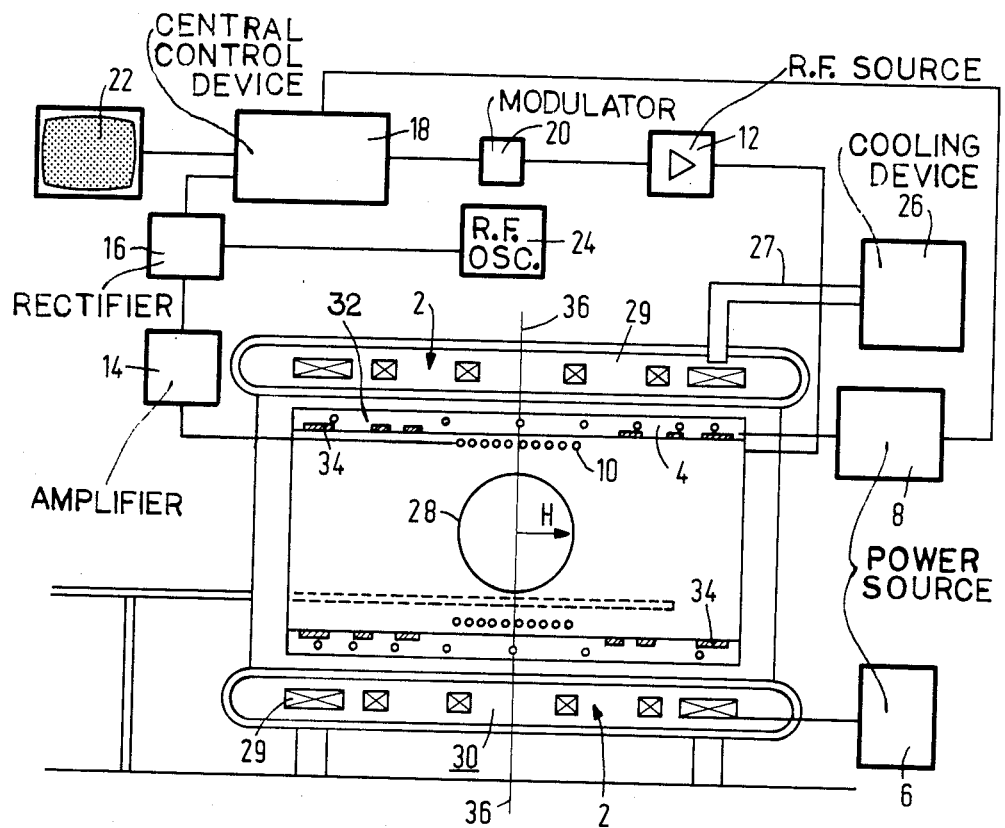

United States Patent [19]

Vreugdenhil et al.

[11] Patent Number: 4,771,243

[45] Date of Patent: Sep. 13, 1988

[54] MAGNETIC RESONANCE IMAGING APPARATUS INCLUDING FIELD-HOMOGENIZING MAGNETIC ELEMENTS

[75] Inventors: Ewoud Vreugdenhil, Eindhoven; Franciscus F. Van Der Vlugt, Lisse, both of Netherlands

[73] Assignee: U.S. Philips Corporation, New York, N.Y.

[21] Appl. No.: 891,849

[22] Filed: Aug. 1, 1986

[30] Foreign Application Priority Data

Aug. 26, 1985 [NL] Netherlands ............................ 8502340

[51] Int. Cl.$^4$ ............................................ G01R 33/20
[52] U.S. Cl. ...................................... 324/320; 335/299
[58] Field of Search ............... 324/318, 309, 320, 319; 335/216, 299

[56] References Cited

U.S. PATENT DOCUMENTS

| | | | |
|---|---|---|---|
| 4,591,789 | 5/1986 | Glover et al. | 324/309 |
| 4,631,481 | 12/1986 | Young et al. | 324/320 |
| 4,652,826 | 3/1987 | Yamamoto et al. | 324/320 |

FOREIGN PATENT DOCUMENTS 2156079  10/1985  United Kingdom ................ 324/319

*Primary Examiner*—Michael J. Tokar
*Assistant Examiner*—Kevin D. O'Shea
*Attorney, Agent, or Firm*—Thomas A. Briody; Algy Tamoshunas

[57] ABSTRACT

In a magnetic resonance imaging apparatus having a comparatively large measurement region, such as used for medical diagnosis, high-order contributions to the magnetic field are compensated for by the addition of pairs of rings made of a soft-magnetic material, so that the homogeneity of the magnetic field is locally increased to a high degree. This makes possible to use a substantially shorter coil while the field homogeneity in the measurement zone is still improved.

21 Claims, 1 Drawing Sheet

MAGNETIC RESONANCE IMAGING APPARATUS INCLUDING FIELD-HOMOGENIZING MAGNETIC ELEMENTS

The invention relates to a magnetic resonance imaging apparatus which includes a magnetic system for generating a steady magnetic field in a measurement space situated within the magnet system, and also relates to a method of designing such an apparatus.

In such an apparatus it is desirable, notably for spatially correlated measurements, that the steady magnetic field in a measurement space within the magnet system has a high spatial homogeneity. Localization of resonance signals to be measured is usually realized by selection in respect of a fixed value of the local magnetic field; this selection can be made via the Larmor equation $\omega = \gamma \beta$ with frequency selection. If no special steps are taken, a magnet system which cannot provide a sufficiently large zone of homogeneity to accommodate the object to be examined, that is to say cannot provide a measurement space in which the homogeneity of the steady magnetic field is sufficiently high for the relevant purpose.

The article "Magnetic field profiling; analysis and correcting coil design" by F. Romeo and D. J. Hoult in "Magnetic resonance in Medicine", Vol. 1, No. 1, March 1984, pages 44–65, describes a correction method which utilizes a mathematical description of the relevant magnetic field. For a magnetic field of a conventional, substantially solenoid-shaped magnet system $\Delta B_2 = 0$, based on Laplace's equation as also mentioned in said article, for the magnetic field measured in the direction of the axis of the solenoid, referred to hereinafter as the z-axis; therefrom a field intensity polynomial can be derived for $B_2$ for magnets composed of concentric coils or coil pairs in which all odd terms are equal to 0 for considerations of symmetry. On the basis of mathematical data, the cited article provides a solution for correction of lower-order errors which are understood to be errors up to the fourth order. As is mentioned, such errors may be caused by magnetic disturbances from the environment, manufacturing tolerances, errors due to irregularities in the turns of the coils, non-optimum positioning of the coils and the like. It is assumed that any error up to fourth order, which means in practice the second and the fourth order errors for zonal errors, is separately reduced to an as low as possible value.

This is not a solution for higher-order errors, notably $6^{th}$ and $8^{th}$ order errors. These errors are due to, for example the coil design as such or due to the restrictions imposed by subsidiary conditions to be satisfied by the coil for practical reasons. For example, in medical diagnostic MRI apparatus the measurement space must be reasonably well accessible for patients to be examined. If the length of the coil is too great, it becomes difficult to position the patient properly within the measurement space. Said higher-order field errors in the design notably cause artefacts in sagittal and coronal images. Any local deviation of the adjusted magnetic field intensity causes a local deviation in the resonant frequency and hence in the image which is based on the local frequency. Image artefacts have an adverse effect on the diagnosis.

It is the object of the invention to mitigate these drawbacks and to provide a magnet system in which the effect of higher-order field errors is reduced within a sufficiently large measurement space. To achieve this, a magnetic resonance imaging apparatus of the kind set forth in accordance with the invention is characterized in that within the magnet system there is provided a magnetic material which increases the spatial field homogeneity also for errors beyond the fourth order.

The introduction of magnetic material, for example in or on a coil former of the magnet system, ensures that the combined contribution of relevant higher order errors in the steady magnetic field is reduced. The mutual compensation of the field errors can be optimally performed for a fixed field intensity of the magnetic system. For strongly deviating field intensities, the compensation will not be optimum, but for comparatively small deviations from the nominal field intensity the homogeneity will still be substantially better than would be the case in the absence of the error-compensating magnetic material. This drawback can be eliminated by utilizing additional auxiliary coils instead of, for example ferromagnetic elements. However, in order to generate sufficiently strong compensating fields such coils must practically be constructed as superconducting coils or as a double coil. A further drawback is that, due to changing magnetic fields in the apparatus such as the required linear auxiliary fields in said auxiliary coils, circular currents are generated which again give rise to disturbing magnetic fields.

In a preferred embodiment, the ferromagnetic elements are preferably formed by pairs of rings which are arranged each time symmetrically with respect to the center of a coil former. In order to prevent the occurrence of circular currents in the rings of magnetic material, the rings can be sub-divided into a plurality of sector arcs by azimuthal interruptions. The rings or ring segments may be accomodated, for example in recesses in a carrier for gradient coils which is customarily arranged within the magnet system for the steady field. The ferromagnetic material of each ring or ring segment may be composed of a stack of wires, but may also be shaped as a band or a strip.

A preferred embodiment utilizes three pairs of ring segments of ferromagnetic material which are symmetrically arranged with respect to the central plane of the magnet system, viewed in the axial direction.

Because larger contribution from each of the relevant higher-order errors can be separately admitted in a coil design in accordance with the invention, the geometry of a magnet system in accordance with the invention will be optimally adapted, within these possibilities, to further requirements to be imposed thereon. A magnet system for generating a steady magnetic field for an apparatus in accordance with the invention is notably constructed so as to be comparatively short and readily accessible to the patient. As a result of the compensation of the individual error contributions, the resultant field will still be homogeneous to a high degree.

On the basis of the described mathematical notation of the relevant magnetic fields and measurements performed at, for example an edge of a measurement space, the compensation of higher-order fields utilizes, for example a method where the resultant of the higher-order contributions to be dealt with is minimized by the axial position, the width and the thickness of ring pairs of ferromagnetic material. For the design of a coil system for a magnetic resonance imaging apparatus in accordance with the invention, the subsidiary conditions, notably the axial dimension of the coil system, can be chosen with a higher degree of freedom, because the contributions of the higher-order errors in the field can still be compensated for at a later stage. An optimum compromise can thus result in a geometrically more attractive magnet system. In particular, it is no longer necessary to attempt, as has been done until now, to reduce each of the higher-order contributions individually. In the case of a superconducting magnet system, the ferromagnetic material can be simply accommodated in a cooled space for the superconducting coils; this may be the helium space as well as a jacket space filled, for example with liquid nitrogen. Using an adapted design, the functions of heat shield and error correction can thus be combined. When accommodated in a cooled space, the ferromagnetic material need be cooled only once and will not form an additional heat leak because no external connections are required. The increased thermal capacity or rather cold reserve can often be used to good advantage.

Some preferred embodiments in accordance with the invention will be described in detail hereinafter with reference to the drawing. Therein:

FIG. 1 shows a magnetic resonance imaging apparatus in accordance with the invention, and FIGS. 2a and 2b show a coil former including magnetic material for such an apparatus.

A magnetic resonance imaging apparatus shown in Figure 1 includes a magnet system 2 for generating a steady, uniform magnetic field H, a magnet system 4 for generating magnetic gradient fields, and power supply sources 6 and 8 for the magnet systems 2 and 4, respectively. An r.f. magnet coil 10 is connected to an r.f. source 12 and serves to generate an r.f. magnetic alternating field. Spin resonance signals generated by the transmitted r.f. field in an object to be examined, can also be detected by the r.f. coil 10. The coil 10 is then connected to a signal amplifier 14. The signal amplifier 14 is connected to a phase-sensitive rectifier 16 which is connected to a central control device 18. The central control device 18 also controls a modulator 20 for the r.f. source 12, the power supply source 8 for the gradient coils, and a monitor 22 for display. An r.f. oscillator 24 controls the modulator 20, as well as the phase-sensitive rectifier 16 which processes the measurement signals. The magnet coils 2 for the main field may be cooled by a cooling device 26 which incudes cooling ducts 27. Such a cooling device may use water for cooling in the case of resistance coils, or liquid helium for cooling of superconducting magnet coils for a high field intensity. The transmitter coil 10 arranged within the magnet systems 2 and 4 encloses a measurement space 28 which is sufficiently large to accomodate patients to be examined in the case of a medical diagnostic apparatus. Thus, in the measurement space 28 there can be generated a uniform magnetic field H, gradient fields for selecting slices of the object, and a spatially uniform r.f. alternating field. Herein, the r.f. coil 10 is assumed to combine the functions of transmitter coil and measurement coil. However, different coils may also be used for the two functions, for example surface coils may be used as the measurement coils.

The coil system 2 for the steady field is in this case formed by six isoradial superconducting coils 29 which are accomodated in a dewar vessel 30 for liquid helium introduced therein from the cooling device 26. It is to be noted that the cooling device may be simply a storage device for liquid helium as well as a helium liquefier. In the latter case the helium evaporated in the dewar vessel is continuously cooled again so that a closed cooling system is obtained. Arranged about the helium dewar vessel there is a conventional jacket which is filled with, for example liquid nitrogen.

A gradient coil holder 32, supporting the gradient coils 4, is arranged inside the coils for the main field, and hence inside the dewar vessel in a customary manner. In accordance with the invention, rings 34 of, for example ferromagnetic material, are mounted in the gradient coil holder 32. For reasons of symmetry, the rings form (except for specific magnet design) ring pairs which are always symmetrically situated with respect to an axial symmetry plane 36 of the magnet system. Using very practical isoradial pairs of rings, the contribution to the homogenizing of the steady magnetic field H in the measurement space 28 is thus determined by the position of the pairs of rings with respect to the symmetry plane 36, by the width of the pairs of rings and by the amount of ferromagnetic material per pair. All rings are rotationally symmetrical, except for specific magnet designs, so that they contain a uniform quantity of magnetic material, measured along the circumference. Subject to said restrictions as regards the use of isoradial symmetrical and uniform pairs of rings of ferromagnetic material for homogenizing the ultimate magnetic field within the measurement space 28, a magnet design can be realized in accordance with the invention, for example as follows. Subsidiary conditions to be satisfied are the miniumum requirements to be imposed as regards the diagnostic images to be realized by means of the apparatus. As a first consequence, the requirements to be imposed on the homogeneity of the steady magnetic field to which the present description is restricted should be formulated. In addition there are technological, structural and geometrical limitations. The technological limitations, for example imply that for comparatively strong fields, for example as from 0.25 tesla, superconducting coils are used. Structural limitations are imposed by, for example the total weight of the apparatus, which means that permanent magnet designs are unsuitable for strong fields. Besides the foregoing limitations, the geometry is also clearly limited by the requirement that the apparatus must be accessible and acceptable to patients to be examined. The accessibility requirement imposes a free inner diameter of, for example approximately 1 m. For a measurement space of customary dimensions, for example a spherical measurement field having a radius of at least 25 cm, such a diameter imposes a minimum length of the coil system of, for example 2.5 m. Notably the latter requirement can lead to a reduced length in accordance with the invention. This is because thus far the effect of any of the higher-order field influences had to remain below a given maximum value to be imposed, for example all effects less than 50 ppm for the measurement region. In accordance with the invention, however, the sum of all higher-order field deviations must remain below said maximum contribution to be imposed; this requirement can also be satisfied by a substantially shorter magnet when ferromagnetic homogenizing elements are used. A first approximation of a permissible minimum length can be obtained by simulation calculations. In such a simulation model the effect of the higher-order errors in the measurement field can be calculated or measured, after which an optimum system of ferromagnetic rings can be determined by calculations. It is to be noted that the non-corrected field may also be produced, for example by a coil design which is not completely isoradial. More or less itteratively a minimum permissible length can thus be stepwise determined for the magnet system. Once some experience has been gained in the use of homogenizing ferromagnetic elements, the reverse approach is also possible, that is to say an approach based on the insight which maximum separate contribution can stil be compensated for in order to obtain design which is as short as possible, after which the compensation can be performed. For homogenizing already existing magnets, it is merely necessary to measure the magnetic field, for example at the edge of the measurement region, after which an optimum, compensating system of ferromagnetic rings can be provided.

As has already been noted, a coil is in principle optimally compensated for only for a fixed field intensity. If it is known in advance that the magnet is to be used, for example, for two field intensities, for example 1.0 and 1.5 tesla, this fact can be taken into account in that optimization is performed either for a mean value or for a preferred value of the two field intensities, taking into account the situation for the other field intensity. This may imply, for example that for an absolute minimum, combined contribution preference is given to a positive or negative error or that the individual contributions are shifted in the sense which favours the other field intensity value while maintaining the mimimum sum value.

When the configuration and the amount of ferromagnetic material have been determined, the material may be arranged so that it does not disturb the accessibility of the spaces within the coils, and also that no adverse shielding or adverse effects on the thermal conditions within the magnet system occur. The carrier for the gradient coils as well as the carrier for shim coils, as well as a common carrier for both types of coils can be used for this purpose. Usually it suffices to use, for example ring pairs having an axial width of, for example from 1 to 10 cm and a radial thickness of, for example at the most 2 cm. In practice, of course, the design will take ease of mounting into account as much as possible.

Figure 2:
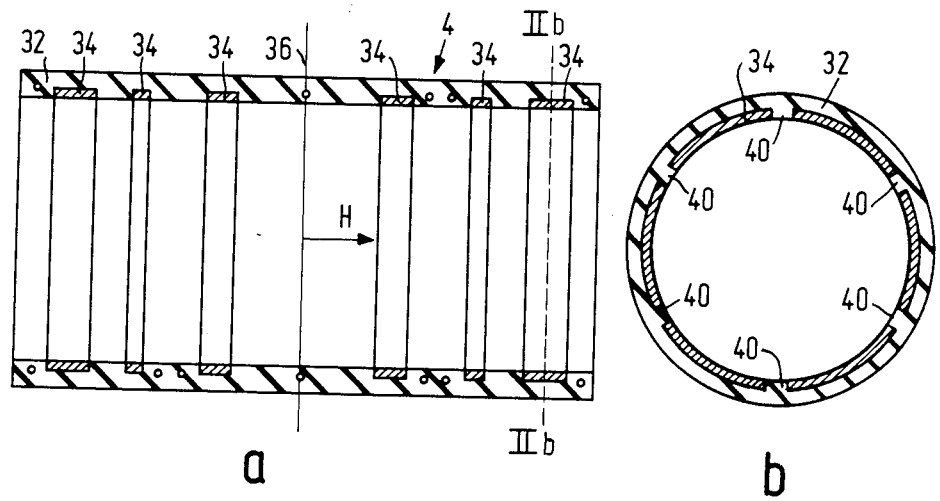

FIG. 2 shows the gradient coil holder 32 with the ferromagnetic rings 34 in an axial cross-sectional view (FIG. 2a) as well as in a radial cross-sectional view at the area of a ring 34 (FIG. 2b). The ferromagnetic elements are accommodated in recesses in the gradient coil holder and, in order to prevent circulating eddy currents, they are divided into segments 42 by means of interruptions 40. Except for specific embodiments, the segments can again be chosen so as to be identical. Notably for empiric determinations, the segments of ferromagnetic material are preferably composed of a comparatively large number of wires or bands of ferromagnetic material which can be separately added or removed for empiric optimization. For normally calculated ferromagnetic elements, single strips may be used which can be mounted in suitable recesses. Though the thickness of the ring pairs is shown to be identical, this is not a stringent requirement. Considering the contributions to each of the order or errors by each ring pair separately, a mutually different width of the ring is often practical. Ferromagnetic material is extremely well suited as the material for the correction rings. However, other magnetic materials, may also be used for example, premagnetized materials such as Noydynium. When the latter type of material is used, two oppositely directed preferred orientations can be imparted to a ring, which enables even more accurate correction in some cases or the use of a smaller amount of material. The use of combinations of several materials of the described type may also offer good results.

What is claimed is:

1. A magnetic resonance imaging apparatus comprising means for producing a steady magnetic field in a measurement space extending about a central axis, means for producing an RF magnetic field in said measurement space, means for producing a magnetic gradient field in said measurement space, said gradient field producing means including a hollow, cylindrical carrier which is generally coaxial with said central axis and a coil arranged on said carrier, said carrier having recesses formed in an inner side thereof, said apparatus further comprising magnetic material provided in said recesses, said magnetic material being arranged so as to increase the spatial homogeneity of said steady magnetic field by correcting for errors higher than the fourth order, and means for detecting spin resonance signals produced by said RF magnetic field in an object to be examined disposed in said measurement space.

2. A magnetic resonance imaging apparatus as claimed in claim 1 wherein the magnetic material is in the form of coaxial, ring-shaped elements.

3. A magnetic resonance imaging apparatus as claimed in claim 2, wherein the ring-shaped elements of magnetic material are sub-divided into a plurality of sector arcs by azimuthal interruptions.

4. A magnetic resonance imaging apparatus as claimed in claim 1, 2 or 3 wherein the magnetic material is formed by stacks or wire-shaped material.

5. A magnetic resonance apparatus as claimed in claim 1, 2 or 3 wherein the magnetic material is arranged substantially in the form of coaxially oriented strips.

6. A magnetic resonance imaging apparatus as claimed in claim 2 or 3 comprising at least three pairs of ring-shaped elements which are adjacently situated, viewed in the axial direction.

7. A magnetic resonance imaging apparatus as claimed in claim 2 or 3 wherein said coaxially arranged ring-shaped elements of magnetic material are spaced by different axial distances from one another.

8. A magnetic resonance imaging apparatus as claimed in claim 1, 2 or 3 wherein the magnetic material consists mainly of ferromagnetic material.

9. A magnetic resonance imaging apparatus as claimed in claim 1, 2 or 3 wherein the homogenizing magnetic material consists at least partly of premagnetized material.

10. A magnetic resonance imaging apparatus as claimed in claim 1, 2 or 3 wherein within a magnet system having an axial dimension of less than 150 cm there can be generated a spherical measuremen region having a diameter of at least 50 cm and a field homogeneity of less than 25 ppm.

11. A magnetic resonance imaging apparatus comprising means for producing a steady magnetic field in a measurement space extending about a central axis, means for producing an RF magnetic field in said measurement space, means for detecting spin resonance signals produced by said RF magnetic field in an object to be examined disposed in said measurement space, and at least one pair of rings of a magnetic material, said rings extending about said measurement space and being adapted to correct field errors of an order higher than the fourth order to thereby increase the spatial homogeneity of said steady magnetic field in said measurement space.

12. A magnetic resonance imaging apparatus as claimed in claim 11, wherein said steady field producing means includes a magnet coil system extending about said measurement space, and wherein said rings are substantially coaxial with said central axis and arranged symmetrically with respect to a plane which is normal to said central axis and passes through the center of said coil system.

13. A magnetic resonance imaging apparatus as claimed in claim 11 or 12, wherein said rings are divided into sector arcs by slits or reduce circulation of eddy currents.

14. A magnetic resonance imaging apparatus as claimed in claim 11 or 12 including at least three pairs of said rings, said rings being spaced from each other along said central axis.

15. A magnetic resonance imaging apparatus as claimed in claim 14 wherein said rings are spaced at different axial distances from each other.

16. A method as claimed in claim 15 wherein the intensity of said field is measured at a number of points which is adapted to the order of magnitude of the terms of the field polynomial whereto the field is homogenized.

17. A method of improving the spatial homogeneity of a steady magnetic field in a measurement space within a magnet system of a magnetic resonance imaging apparatus, said method comprising the steps of measuring the intensity of said steady magnetic field in said measurement space, determining, from data obtained from said measurement, coefficients of different orders of a field intensity polynomial which describes said steady magnetic field, determining, from said coefficients, the position and quantity of ferromagnetic material required for compensation of errors of an order higher than the fourth order, and adjusting the position and/or quantity of said magnetic material until the desired spatial homogeneity in the magnetic field in said measurement space is obtained.

18. A method as claimed in claim 17 wherein the magnetic field measurements are performed on a surface of said measurement space.

19. A method as claimed in claim 17 wherein the field measurements are at least also used for reducing field inhomogeneities by mutual compensation thereof.

20. A method as claimed in claim 17 wherein the desired physical dimensions of said magnet system are first chosen while permitting spatial field inhomogeneities, after which the field inhomogeneities are reduced by means of said ferromagnetic material introduced into the magnet system.

21. A method as claimed in claim 17 wherein, in order to compensate for zonal disturbances, said ferromagnetic material is in the form of substantially ring-shaped correction elements which are coaxially oriented about an axis of the magnet system.

* * * * *

UNITED STATES PATENT AND TRADEMARK OFFICE
CERTIFICATE OF CORRECTION

PATENT NO. : 4,771,243
DATED : September 13, 1988
INVENTOR(S) : Ewoud Vreugdenhil et al It is certified that error appears in the above-identified patent and that said Letters Patent is hereby corrected as shown below:

IN THE CLAIMS

Column 7, Claim 13, line 3   change "or" to --to--

Signed and Sealed this

Twenty-first Day of March, 1989

Attest:

DONALD J. QUIGG

Attesting Officer      Commissioner of Patents and Trademarks